(12) United States Patent
Jung et al.

(10) Patent No.: US 8,879,672 B2
(45) Date of Patent: Nov. 4, 2014

(54) SIGNAL COMPRESSION APPARATUS AND METHOD FOR DYNAMIC COMPRESSIVE SENSING USING SPARSITY INFORMATION OF INPUT SIGNAL

(71) Applicant: Electronics and Telecommunications Research Institute, Daejeon (KR)

(72) Inventors: Hoi Yoon Jung, Daejeon (KR); Sun Min Lim, Daejeon (KR); Jae Hyun Park, Busan (KR); Byung Jang Jeong, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/777,121

(22) Filed: Feb. 26, 2013

(65) Prior Publication Data

US 2014/0126617 A1    May 8, 2014

(30) Foreign Application Priority Data

Nov. 5, 2012  (KR) .......................... 10-2012-0124288

(51) Int. Cl.
*H04L 27/06* (2006.01)
*H03M 7/46* (2006.01)

(52) U.S. Cl.
CPC ...................................... *H03M 7/46* (2013.01)
USPC ........... 375/340; 375/224; 375/227; 375/240; 375/316

(58) Field of Classification Search
CPC ........ H03M 7/30; H03M 7/46; H04L 1/0045; H04L 5/0007; H04L 25/067; H04L 27/006; H04B 1/66

USPC .......................... 375/224, 227, 240, 316, 340
See application file for complete search history.

(56) References Cited

U.S. PATENT DOCUMENTS

| | | |
|---|---|---|
| 8,644,244 B2 * | 2/2014 | Sexton et al. ................. 370/330 |
| 2011/0164745 A1 * | 7/2011 | Marzetta et al. ............... 380/28 |
| 2012/0203810 A1 | 8/2012 | Ashikhmin |
| 2013/0148713 A1 * | 6/2013 | Lee et al. ...................... 375/240 |

* cited by examiner

*Primary Examiner* — Leon Flores
(74) *Attorney, Agent, or Firm* — Nelson Mullins Riley & Scarborough LLP; Anthony A. Laurentano, Esq.; Lewis Lee, Esq.

(57) ABSTRACT

Disclosed are a signal compression apparatus and method for dynamic compressive sensing, including: a signal input unit configured to simultaneously output an input signal, and generate and output a linear measurement reference signal based on the input signal; a linear transform unit configured to receive the linear measurement reference signal and variably generate a linear measurement matrix value according to the linear measurement reference signal; a signal compressor configured to output a compressed signal for the input signal based on the generated linear measurement matrix value; and a signal processor configured to reconstruct the compressed signal and perform spectrum sensing of the input signal. Accordingly, it is possible to increase signal compression efficiency of compressive sensing and improve signal reconstruction performance by using sparsity information of the input signal, and also by performing signal compression by using a compression matrix suitable for the sparsity information of the input signal.

18 Claims, 6 Drawing Sheets

SIGNAL COMPRESSION APPARATUS AND METHOD FOR DYNAMIC COMPRESSIVE SENSING USING SPARSITY INFORMATION OF INPUT SIGNAL

CROSS-REFERENCE TO RELATED APPLICATIONS

This application claims priority to and the benefit of Korean Patent Application No. 10-2012-0124288 filed in the Korean Intellectual Property Office on NOVEMBER 05, 2012, the entire contents of which are incorporated herein by reference.

TECHNICAL FIELD

The present invention relates to a signal compression apparatus and method for dynamic compressive sensing, and more particularly, to a signal compression apparatus and method for dynamic compressive sensing which acquire sparsity information of an input signal during a signal compression process of compressive sensing and dynamically use the acquired sparsity information in a signal compression operation.

BACKGROUND ART

In a conventional signal processing technology field, when a signal is sampled with two times a maximum signal frequency or larger based on a Shannon-Nyquist sampling theory, a signal component may be accurately reconstructed, and accordingly, two times the maximum signal frequency or larger is always used for a sampling frequency. However, it is currently identified that an original signal component can be reconstructed without incurring any loss through a new theory of compressive sensing even though a sampling frequency equal to or smaller than two times the maximum signal frequency is used.

The compressive sensing theory is based on sparsity of the signal. When any signal is observed by a random domain, most of the signal components become 0, and a few of the signal components have non-zero components. The signal is called a sparse signal. At this time, the number of signal components with non-zero values corresponds to sparsity.

For example, most components of a sinusoidal signal continuous on a time axis have non-zero values. However, when viewed from a frequency axis, the signal has the non-zero value only in a particular frequency, and most of the remaining frequency components have values of 0. The compressive sensing theory mainly says that the sparse signal may be reconstructed with only slight linear measurement without incurring loss of an original signal.

When an input sparse signal for performing the compressive sensing is x, a length of the sparse signal x is N, and sparsity of the sparse signal x, that is, the number of non-zero components in a particular domain is K, a linear measurement equation is defined in Equation (1).

$$y=Ax \quad (1)$$

Here, A denotes a matrix having a size of M×N, wherein M has a value smaller than N and a length of a result value y of the linear measurement becomes M. Here, M/N is a compression rate of the signal, and efficiency of the compressive sensing increases when M is reduced to a minimum value possible. Meanwhile, a condition for reconstructing an original signal x by using a compressed signal y in the compressive sensing is generally defined as shown in Equation (2) for M, N, and sparsity K.

$$M > O(K \log(N/K)) \quad (2)$$

Accordingly, in the compressive sensing, in order to reconstruct the original signal x from the compressed data y without any loss, a value of M should satisfy equation (2). Simultaneously, in order to achieve a maximum of compression efficiency, the value of M should be set to a minimum value, so that the value of M should be a minimum value satisfying Equation (2) to normally reconstruct the signal and improve the compression efficiency for compressive sensing.

Meanwhile, since sparsity information of the input signal x cannot be known in a conventional compressive sensing method, the compressive sensing is generally performed using a fixed A matrix. FIG. 1 illustrates an example of a signal compression process of the conventional compressive sensing method. Referring to FIG. 1, the input signal x transferred from a signal input unit 10 is converted to the output signal y through an operation with the A matrix by a signal compressor 20, and transferred to a signal processor 30. In the conventional method, the A matrix is fixedly predefined regardless of the sparsity of the input signal x, and a fixed value of M cannot satisfy Equation (2), so that it is failed to normally reconstruct the signal or compression efficiency of the signal is reduced since an unnecessarily large value of M is used.

SUMMARY OF THE INVENTION

The present invention has been made in an effort to provide a signal compression apparatus and method for dynamic compressive sensing which improve efficiency and performance of compressive sensing signal processing by actively processing an input signal by using sparsity information of the input signal.

An exemplary embodiment of the present invention provides a signal compression apparatus for dynamic compressive sensing, including: a signal input unit configured to simultaneously output an input signal, and generate and output a linear measurement reference signal based on the input signal; a linear transform unit configured to receive the linear measurement reference signal and variably generate a linear measurement matrix value according to the linear measurement reference signal; and a signal compressor configured to output a compressed signal for the input signal based on the generated linear measurement matrix value.

The signal input unit may be an RF receiver including a received signal strength indication (RSSI) measurement unit configured to measure an RSSI.

The RF receiver may estimate sparsity information on time and frequency domains of an input RF analog signal.

The RF receiver may estimate the sparsity information by using the received signal strength indication (RSSI).

The RSSI measurement unit may output the received signal strength indication (RSSI) in proportion to a spectrum occupancy rate of the input signal.

The RF receiver may estimate the sparsity information in inverse proportion to the received signal strength indication (RSSI).

The linear transform unit may determine the linear measurement matrix value by receiving the received signal strength indication from the RF receiver.

The signal compressor may be an analog-to-information converter (AIC) including an A/D converter configured to convert an analog input signal to a digital input signal.

The linear transform unit may determine the linear measurement matrix value corresponding to a section value of the received signal strength indication (RSSI) by using a preset codebook or lookup table.

The signal compression apparatus may further include a signal processor configured to reconstruct the compression signal and perform spectrum sensing of the input signal.

Another exemplary embodiment of the present invention provides a signal compression method for dynamic compressive sensing, including: inputting a signal by simultaneously outputting an input signal and generating a linear measurement reference signal based on the input signal; generating a linear matrix by receiving the linear measurement reference signal and variably generating a linear measurement matrix value according to the linear measurement reference signal; compressing a signal by outputting a compressed signal for the input signal based on the generated linear measurement matrix value; and processing a signal by reconstructing the compressed signal and performing spectrum sensing of the input signal.

The inputting of the signal may include measuring a received signal strength indication (RSSI) and estimating the sparsity information by using the received signal strength indication (RSSI).

The compressing of the signal may include determining the linear measurement matrix value based on the received signal strength indication (RSSI).

The compressing of the signal may include determining the linear measurement matrix value corresponding to a section value of the received signal strength indication (RSSI) by using a preset codebook or lookup table.

Yet another exemplary embodiment of the present invention provides a signal compression apparatus for dynamic compressive sensing, including: a signal input unit configured to output an input signal; a compressive sensing unit configured to variably generate a linear measurement matrix value by receiving the input signal and estimating a linear measurement reference signal, and output a compressed signal for the input signal based on the generated linear measurement matrix value; and a signal processor configured to reconstruct the compressed signal and perform spectrum sensing of the input signal.

The signal input unit may be an RF receiver, and the compressive sensing unit may include an RSSI measurement unit configured to estimate the sparsity information of the input signal by measuring a received signal strength indication (RSSI), a linear measurement matrix determiner configured to determine the linear measurement matrix value by using the sparsity information, and a signal compressor configured to generate and output the compressed signal of the input signal by using the determined linear measurement matrix value.

The signal input unit may be an RF receiver, and the compressive sensing unit may include an occupancy state estimator configured to estimate a spectrum occupancy state of the input signal, a linear measurement matrix determiner configured to variably determine a size and components of the linear measurement matrix by using the estimated spectrum occupancy state, and a signal compressor configured to generate and output the compressed signal of the input signal by using the determined linear measurement matrix value.

A signal compression apparatus and method for dynamic compressive sensing according to exemplary embodiments of the present invention have effects of increasing signal compression efficiency of compressive sensing and improving signal reconstruction performance by using sparsity information of an input signal.

A signal compression apparatus and method for dynamic compressive sensing according to exemplary embodiments of the present invention have effects of increasing compression efficiency of compressive sensing and improving signal reconstruction performance by performing signal compression using a compression matrix suitable for sparsity information of the input signal.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
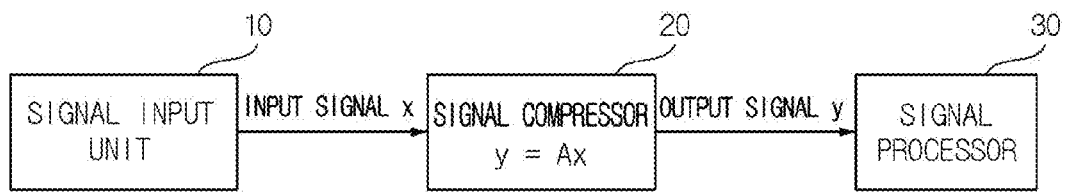
FIG. 1 is a conceptual diagram of a signal compression apparatus for compressive sensing in the prior art.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, exemplary embodiments of the present invention will be described in detail with reference to the accompanying drawings. In the following description, when designating reference numerals to elements of each drawing, the same elements will be designated by the same reference numerals although they are shown in different drawings. Herein, a detailed description of known functions and configurations incorporated herein will be omitted when it may make the subject matter of the present invention rather unclear, and a term in a singular form may include a plurality of concepts. Although preferred embodiments of the present invention will be described below, the technical scope of the present invention is not limited thereto, and may be changed and implemented in various forms by those skilled in the art.

Figure 2:
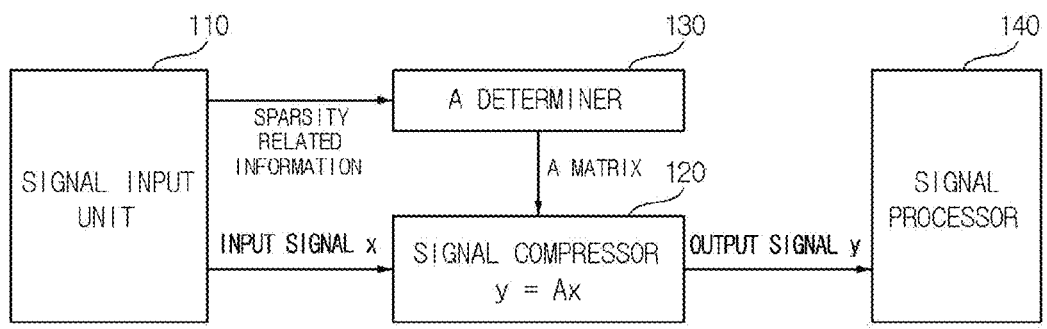
FIG. 2 is a conceptual diagram of a signal compression apparatus for dynamic compressive sensing according to an exemplary embodiment of the present invention.
Figure 3:
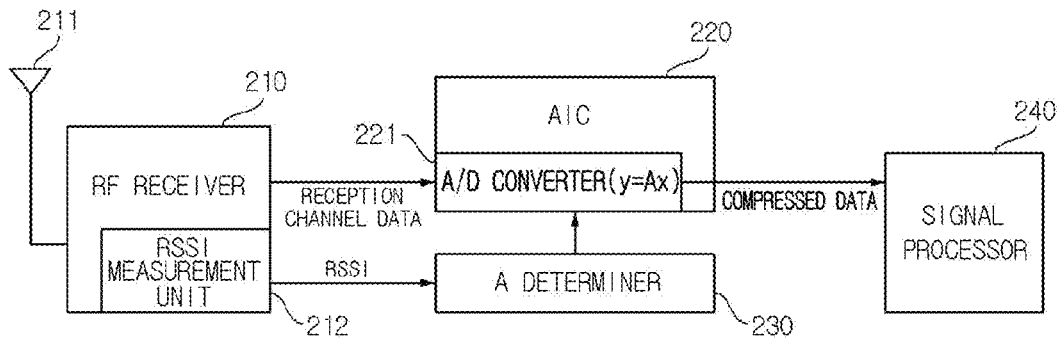
FIG. 3 is a conceptual diagram of spectrum sensing of a cognitive radio system for receiving sparsity information from the outside and performing dynamic compressive sensing according to an exemplary embodiment of the present invention.
Figure 4:
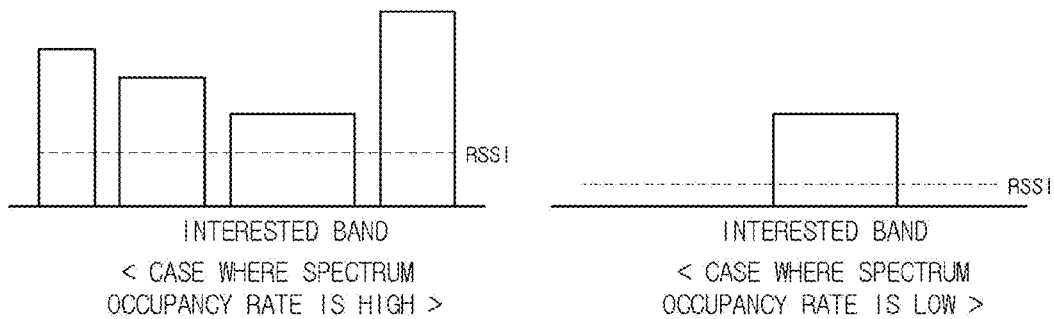
FIG. 4 is an illustrative diagram of a received signal strength indication (RSSI) and a spectrum occupancy rate.
Figure 5:
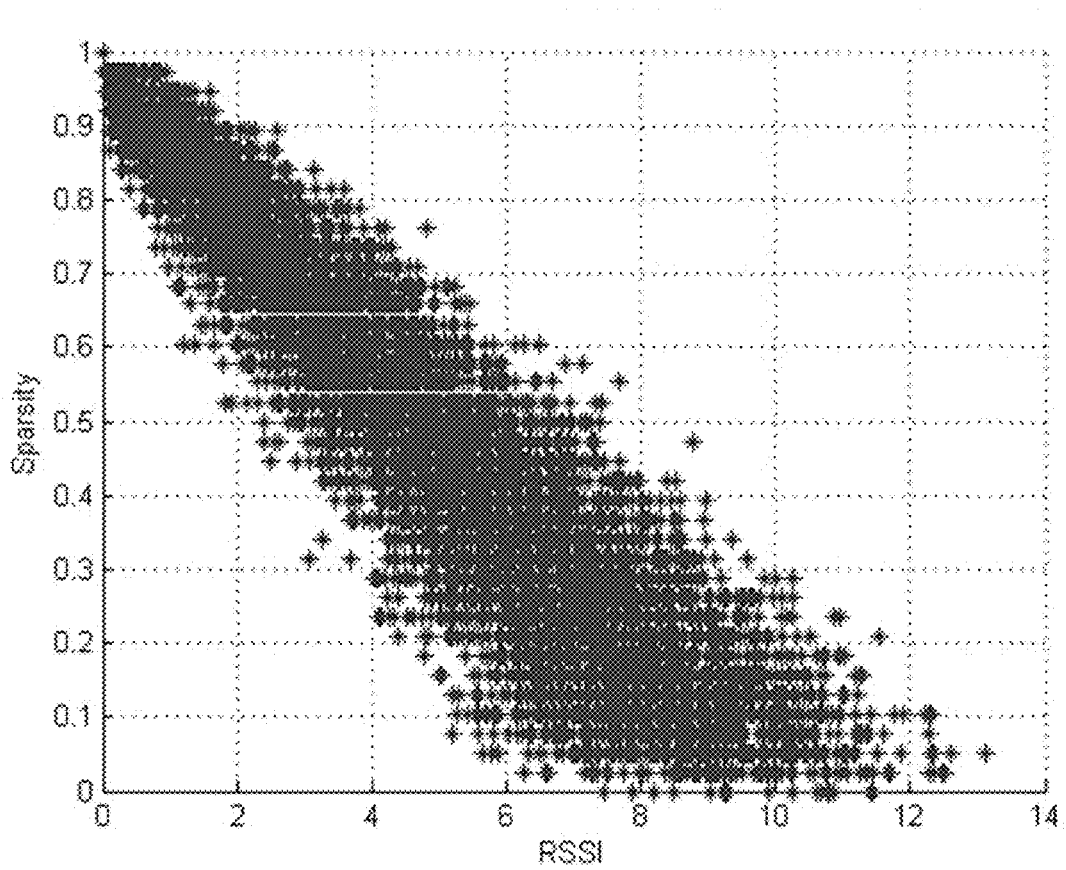
FIG. 5 is a diagram illustrating a simulation result for proving a relationship between an RSSI and signal sparsity.
Figure 9:
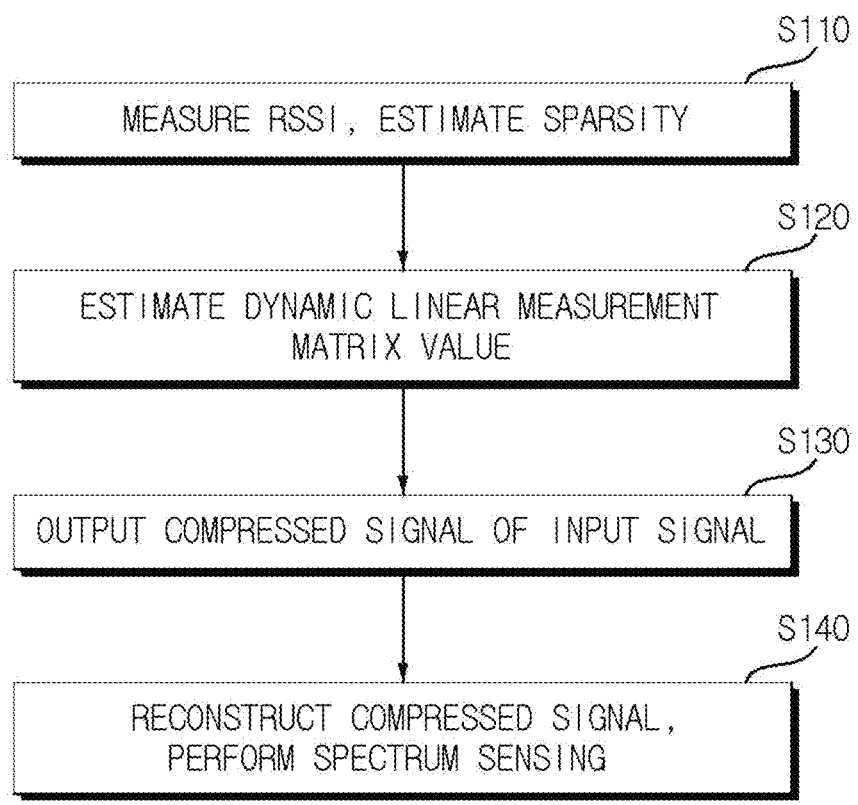
FIG. 9 is a flowchart of a signal compression method for dynamic compressive sensing according to an exemplary embodiment of the present invention.

FIG. 2 is a conceptual diagram of a signal compression apparatus for dynamic compressive sensing according to an exemplary embodiment of the present invention, FIG. 3 is a conceptual diagram of spectrum sensing of a cognitive radio system for receiving sparsity information from the outside and performing dynamic compressive sensing according to an exemplary embodiment of the present invention, FIG. 4 is an illustrative diagram of a received signal strength indication (RSSI) and a spectrum occupancy rate, FIG. 5 is a simulation result diagram for proving a relationship between RSSI and signal sparsity, and FIG. 9 is a flowchart of a signal compression method for dynamic compressive sensing according to an exemplary embodiment of the present invention.

Hereinafter, a signal compression apparatus and method for dynamic compressive sensing according to an exemplary embodiment of the present invention will be described with reference to FIGS. 2 to 5 and FIG. 9.

First, the process of acquiring sparsity information of the input signal has a method of receiving the sparsity information of the input signal from the outside or a method of estimating the sparsity information of the input signal by itself during the compressive sensing process. An example where the sparsity information of the input signal is received from the outside and then used for signal compression is illustrated in FIG. 2.

As illustrated in FIG. 2, the signal compression apparatus for dynamic compressive sensing according to an exemplary embodiment of the present invention includes a signal input unit 110 configured to output an input signal, and generate and output a linear measurement reference signal based on the input signal, a linear transform unit 130 configured to receive the linear measurement reference signal and variably generate a linear measurement matrix value according to the linear measurement reference signal, a signal compressor 120 configured to output a compression signal for the input signal based on the generated linear measurement matrix value, and a signal processor 140 configured to reconstruct the compression signal and perform spectrum sensing of the input signal, and acquires sparsity information of the input signal to dynamically use the sparsity information in compressing the input signal. Hereinafter, for assisting the understanding, the linear transform unit 130 will be referred to as an A determiner 130 in the present exemplary embodiment.

The signal input unit 110 simultaneously provides an input signal x for compression to the signal compressor 120 and transfers sparsity information of the input signal to the separate A determiner 130 (step S110). At this time, the A determiner 130 may exist within the signal compressor 120. The A determiner 130 determines an A matrix for signal compression by using the received sparsity information of the input signal and transfers the A matrix to the signal compressor 120. The signal compressor 120 performs the signal compression for the input signal x received from the signal input unit 110 by using information on the A matrix received from the A determiner 130 and transfers a compressed output signal y to the signal processor 140 (step S130).

FIG. 3 illustrates an example where an input signal receiving side receives sparsity information of the input signal and a signal compression method for dynamic compressive sensing according to an exemplary embodiment of the present invention is applied to a spectrum sensing process of a cognitive radio system.

In this case, an RF receiver 210 may receive RF channel data for spectrum sensing through an antenna 211, convert a received RF analog signal to a baseband signal, transfer the converted baseband signal to a signal compressor 220, and approximately estimate sparsity information on a time and a frequency of the signal by itself during a process of receiving the analog signal (step S110). As an example of estimating the sparsity information, an RSSI measurement unit 212 within the RF receiver 210 may estimate the sparsity information of the input signal by using received signal strength indication (RSSI) information of the signal.

The RSSI is a scale of measuring an average strength of received signals. The RSSI becomes large when a spectrum occupancy rate of the signal is high on the frequency, and the RSSI becomes small when the spectrum is sparse. FIG. 4 conceptually illustrates the above phenomenon, which shows a relationship between the RSSI and the spectrum occupancy rate.

When the spectrum occupancy rate is high, a plurality of channels is used, so that an average RSSI value becomes large. When the spectrum occupancy rate is low, the average RSSI value becomes small.

FIG. 5 illustrates a simulation result for proving a relationship between the RSSI and the sparsity information of the input signal. Specifically, FIG. 5 is a graph illustrating a simulation result of the relationship between the RSSI and the sparsity information when a signal existence probability is uniformly distributed between 0 and 1 and signal strength is uniformly distributed between 0 and 1 for 38 frequency channels. As illustrated in FIG. 5, it may be identified that the RSSI and the sparsity of the input signal are generally inversely related.

In using the cognitive radio system for the spectrum sensing according to the present exemplary embodiment based on the simulation result of FIG. 5, a method of receiving RSSI information from the RF receiver 210, determining the A matrix based on the RSSI information, and performing the signal compression is used. Channel data received by the RF receiver 210 is transferred to an analog-to-digital (A/D) converter 221 within an analog-to-information converter (AIC) 220, and measured RSSI information is transferred to an A determiner 230 configured inside or outside the AIC 220. The A determiner 230 determines an A matrix suitable for the corresponding channel data based on the received RSSI information and transfers information related to the determined A matrix to the A/D converter. Although the A determiner 230 is configured outside the AIC 220 in the present exemplary embodiment, the A determiner 230 may be configured inside the AIC 220. The position of the A determiner 230 does not limit the scope of the present invention.

At this time, the signal compression apparatus for dynamic compressive sensing according to FIGS. 2 and 3 may simplify the implementation by employing a structure of configuring sparsity information and A matrixes suitable for the sparsity information in a form of a codebook or a lookup table and using a most suitable matrix of the A matrixes stored in a memory in the signal compression according to the input sparsity information, without calculating the A matrix according to the received sparsity information every time in the A matrix determining process using the sparsity information. For example, in a case where an RSSI value of the input signal is used in a structure shown in FIG. 3, an A1 matrix is used when the RSSI value is equal to or smaller than a, and an A2 matrix is used when the RSSI value is equal to or larger than a and smaller than b, thereby increasing implementation easiness. Here, b>a.

The A/D converter 221 within the AIC 220 performs a compressive sensing operation such as Equation (1) for the reception channel data x received from the RF receiver 210 and the A matrix determined by the A determiner 230. The A/D converter 221 transfers the data y corresponding to a result value of the compressive sensing operation to the signal processor 240. At this time, the signal processor 240 performs processes such as compressed signal reconstruction, spectrum sensing and the like. Meanwhile, when a case where the compressive sensing is applied to the A/D process is the AIC, it is possible to significantly reduce loads of conventional A/D implementation and costs through such a method.

Hereinafter, a signal compression apparatus for dynamic compressive sensing which determines a compression matrix by itself in a signal compression process according to another exemplary embodiment of the present invention will be described with reference to FIGS. 6 to 8.

Figure 6:
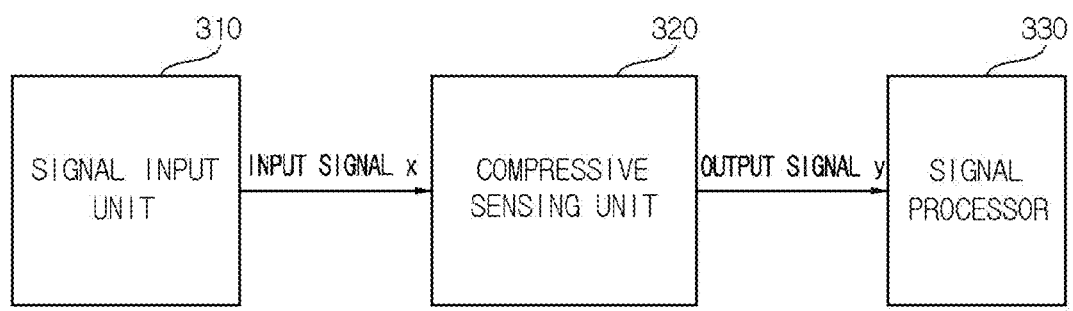
FIG. 6 is a conceptual diagram of a signal compression apparatus for dynamic compressive sensing according to another exemplary embodiment of the present invention.
Figure 7:
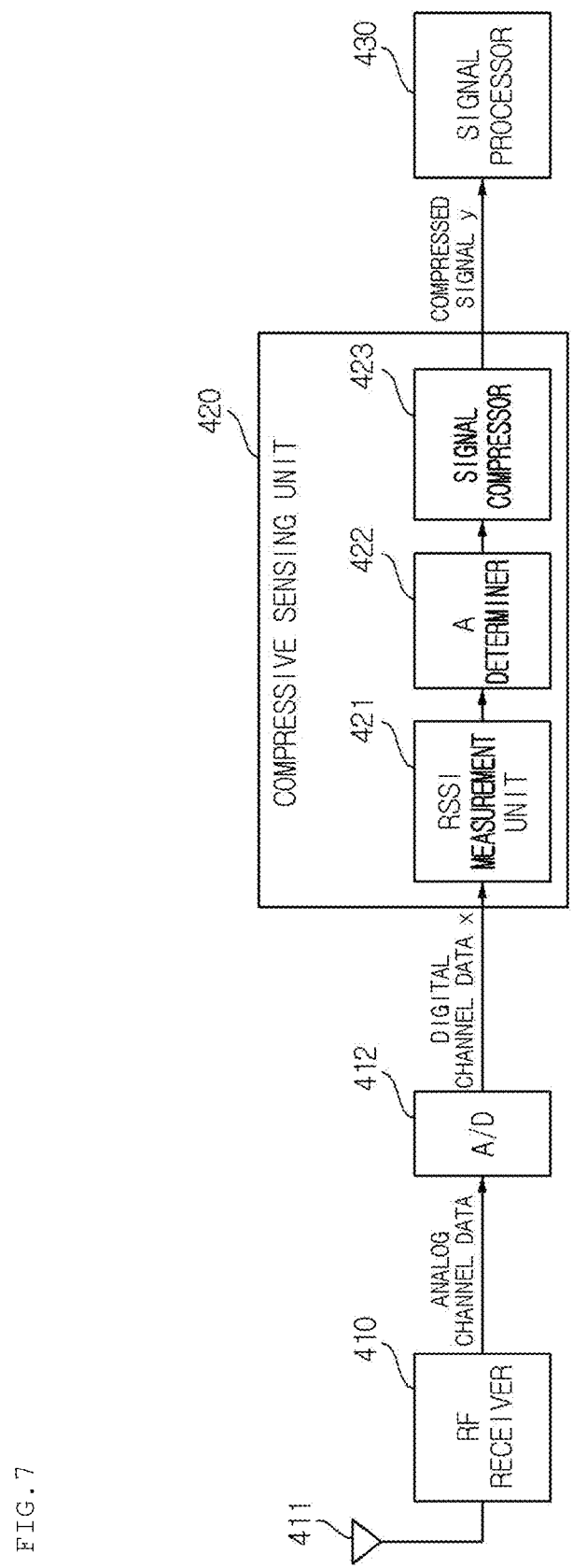
FIG. 7 is a conceptual diagram of spectrum sensing of a cognitive radio system for estimating sparsity information during a signal compression process and performing dynamic compressive sensing according to another exemplary embodiment of the present invention.
Figure 8:
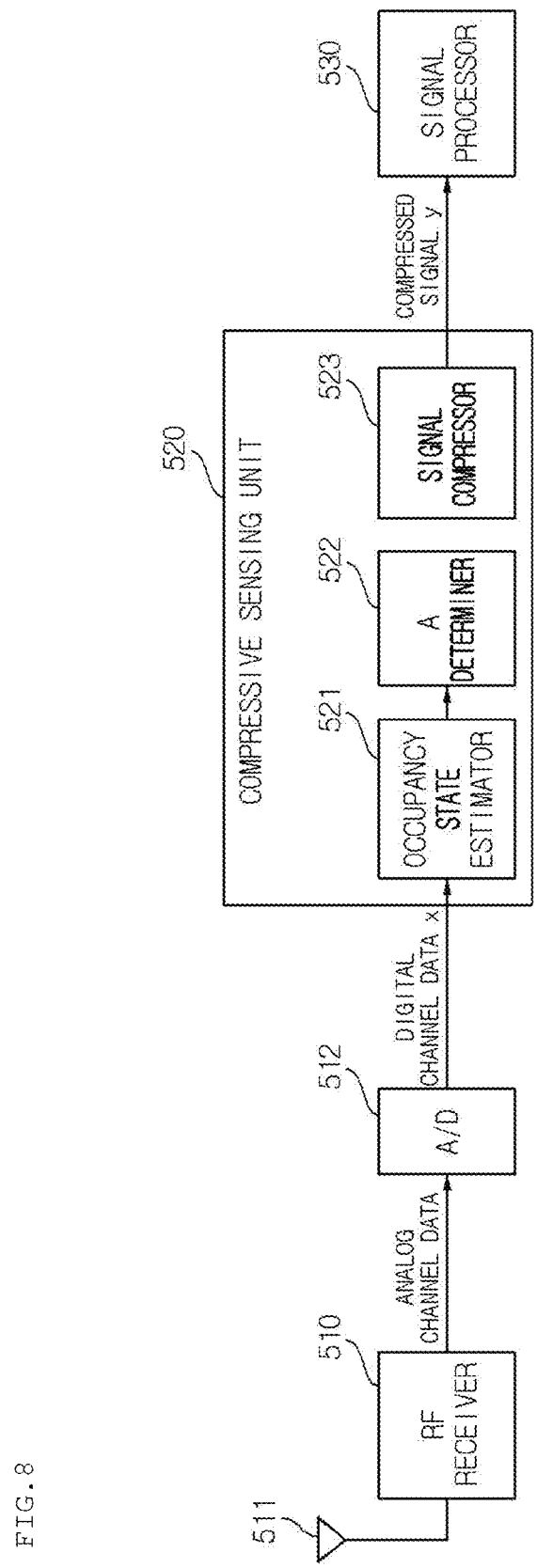
FIG. 8 is a conceptual diagram of spectrum sensing of another cognitive radio system for estimating sparsity information during a signal compression process and performing dynamic compressive sensing according to yet another exemplary embodiment of the present invention.

FIG. 6 is a conceptual diagram of a signal compression apparatus for dynamic compressive sensing according to another exemplary embodiment of the present invention, FIG. 7 is a conceptual diagram of spectrum sensing of a cognitive radio system for estimating sparsity information during a signal compression process and performing dynamic compressive sensing according to another exemplary embodiment of the present invention, and FIG. 8 is a conceptual diagram of spectrum sensing of another cognitive radio system for estimating sparsity information during a signal compression process and performing dynamic compressive sensing according to yet another exemplary embodiment of the present invention.

As illustrated in FIG. 6, the signal compression apparatus for dynamic compressive sensing according to another exemplary embodiment of the present invention includes a signal input unit 310 configured to output an input signal, a compressive sensing unit 320 configured to variably generate a linear measurement matrix value by receiving the input signal and estimating a linear measurement reference signal, and output a compression signal for the input signal based on the generated linear measurement matrix value, and a signal processor 330 configured to reconstruct the compression signal and perform spectrum sensing of the input signal.

As illustrated in FIG. 6, the signal compression apparatus for dynamic compressive sensing according to another exemplary embodiment of the present invention estimates sparsity information of the input signal by itself during a compressive sensing process. Unlike the signal compression apparatus for dynamic compressive sensing according to the exemplary embodiment of the present invention illustrated in FIG. 2, in the signal compression apparatus for dynamic compressive sensing according to another exemplary embodiment of the present invention, the signal input unit 310 transfers only an input signal x to the compressive sensing unit, and the compressive sensing unit 320 estimates sparsity information for the received input signal x by itself, determines an A matrix suitable for the estimated sparsity information, performs the signal compression process such as Equation (1), and then transfers a compressed output signal y to the signal processor 330.

FIG. 7 illustrates one embodiment when a compressive sensing method of determining a compression matrix by itself in the signal compression process illustrated in FIG. 6 is used for spectrum sensing of the cognitive radio system. Analog channel data received from an RF receiver 410 via an antenna 411 is converted to digital channel data while passing through an A/D converter 412 and transferred to a compressive sensing unit 420. The compressive sensing unit 420 measures an RSSI value for given digital channel data x through an RSSI measurement unit 421 to estimate sparsity information of the input signal, and an A determiner 422 determines an A matrix suitable for the estimated sparsity information based on the estimated sparsity information. A signal compression unit 423 performs signal compression by using the determined A matrix, and the compressed signal y is transferred to a signal processor 430 and is passed through processes such as compressed signal reconstruction, spectrum sensing and the like.

FIG. 8 illustrates an exemplary embodiment where RSSI information may be estimated and a spectrum occupancy state may also be estimated during the compressive sensing process in an application example of the signal compression apparatus for compressive sensing illustrated in FIG. 7.

Referring to FIG. 8, analog channel data received from an RF receiver 510 via an antenna 511 is converted to digital channel data while passing through an A/D converter 512 and transferred to a compressive sensing unit 520. The compressive sensing unit 520 estimates a spectrum occupancy state as well as sparsity information of the input signal by measuring an RSSI value for given digital channel data x through an occupancy state estimator 521, and the A determiner 522 determines an A matrix suitable for the estimated sparsity information and spectrum occupancy state based on the estimated sparsity information and spectrum occupancy state. A signal compression unit 523 performs signal compression by using the determined A matrix, and a compressed signal y is transferred to a signal processor 530 and is passed through processes such as compression signal reconstruction, spectrum sensing and the like.

Like the signal compression apparatus for compressive sensing of FIG. 8, the compressive sensing unit 520 may estimate the spectrum occupancy state, so that the compressive sensing unit 520 can know the occupied part of the spectrum in advance. Accordingly, it is possible to dynamically change a size of the A matrix and also components of the A matrix according to the occupied part. On the other hand, when the signal compression apparatus for compressive sensing illustrated in FIG. 7 estimates the spectrum occupancy rate through the RSSI, only the sparsity information of the input signal can be estimated, but information on the occupied part of the spectrum cannot be known, so that only the size of the A matrix may be determined.

As a result, as illustrated in FIGS. 6 and 7, when the compressive sensing is applied after the A/D conversion, there is an advantage in that operation amounts of the signal processing process can be significantly reduced. In the signal compression process of the compressive sensing method, efficiency and performance of the compressive sensing can be improved by acquiring in advance and using sparsity information of the input signal.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A signal compression apparatus for dynamic compressive sensing, comprising:
   a signal input unit configured to simultaneously output an input signal, and generate and output a linear measurement reference signal based on the input signal;
   a linear transform unit configured to receive the linear measurement reference signal and variably generate a linear measurement matrix value according to the linear measurement reference signal;
   a signal compressor configured to output a compressed signal for the input signal based on the generated linear measurement matrix value; and
   a signal processor configured to reconstruct the compressed signal and perform spectrum sensing of the input signal,
   wherein the signal input unit is an RF receiver including a received signal strength indication (RSSI) measurement unit configured to measure an RSSI,
   wherein the RF receiver estimates the linear measurement reference signal by using the RSSI.

2. The signal compression apparatus of claim 1, wherein the linear measurement reference signal is sparsity information of the input signal.

3. The signal compression apparatus of claim 2, wherein the RF receiver estimates the sparsity information by using the received signal strength indication (RSSI).

4. The signal compression apparatus of claim 3, wherein the RSSI measurement unit outputs the received signal strength indication (RSSI) in proportion to a spectrum occupancy rate of the input signal.

5. The signal compression apparatus of claim 3, wherein the RF receiver estimates the sparsity information in inverse proportion to the received signal strength indication (RSSI).

6. The signal compression apparatus of claim 2, wherein the linear transform unit determines the linear measurement matrix value by receiving the received signal strength indication from the RF receiver.

7. The signal compression apparatus of claim 2, wherein the signal compressor is an analog-to-information converter (AIC) including an A/D converter configured to convert an analog input signal to a digital input signal.

8. The signal compression apparatus of claim 1, wherein the linear transform unit determines the linear measurement matrix value corresponding to a section value of the received signal strength indication (RSSI) by using a preset codebook or lookup table.

9. A signal compression method for dynamic compressive sensing, comprising:
   inputting a signal by simultaneously outputting an input signal and generating a linear measurement reference signal based on the input signal;
   generating a linear matrix by receiving the linear measurement reference signal and variably generating a linear measurement matrix value according to the linear measurement reference signal;
   compressing a signal by outputting a compressed signal for the input signal based on the generated linear measurement matrix value; and
   processing a signal by reconstructing the compressed signal and performing spectrum sensing of the input signal,
   wherein the inputting of the signal comprises measuring a received signal strength indication (RSSI) and estimating the sparsity information by using the RSSI.

10. The signal compression method of claim 9, wherein the linear measurement reference signal is sparsity information of the input signal.

11. The signal compression method of claim 9, wherein the received signal strength indication (RSSI) is output in proportion to a spectrum occupancy rate of the input signal.

12. The signal compression method of claim 10, wherein the sparsity information is estimated in inverse proportion to the received signal strength indication (RSSI).

13. The signal compression method of claim 10, wherein the compressing of the signal comprises determining the linear measurement matrix value based on the received signal strength indication (RSSI).

14. The signal compression method of claim 10, wherein the compressing of the signal comprises determining the linear measurement matrix value corresponding to a section value of the received signal strength indication (RSSI) by using a preset codebook or lookup table.

15. A signal compression apparatus for dynamic compressive sensing, comprising:
   a signal input unit configured to output an input signal;
   a signal transform unit configured to variably generate a linear measurement matrix value by receiving the input signal and estimating a linear measurement reference signal, and output a compressed signal for the input signal based on the generated linear measurement matrix value; and
   a signal processor configured to reconstruct the compressed signal and perform spectrum sensing of the input signal,
   wherein the signal input unit is an RF receiver, and the signal transform unit comprises a received signal strength indication (RSSI) measurement unit configured to estimate the linear measurement reference signal of the input signal by measuring a RSSI.

16. The signal compression apparatus of claim 15, the linear measurement reference signal is sparsity information of the input signal.

17. The signal compression apparatus of claim 16, wherein the signal transform unit comprises a linear measurement matrix determiner configured to determine the linear measurement matrix value by using the sparsity information, and a signal compressor configured to generate and output the compressed signal of the input signal by using the determined linear measurement matrix value.

18. The signal compression apparatus of claim 17, wherein the signal input unit is the RF receiver, and the signal transform unit comprises an occupancy state estimator configured to estimate a spectrum occupancy state of the input signal, a linear measurement matrix determiner configured to variably determine a size and components of the linear measurement matrix by using the estimated spectrum occupancy state, and a signal compressor configured to generate and output the compressed signal of the input signal by using the determined linear measurement matrix value.

* * * * *